US012677612B2

(12) United States Patent
Sano et al.

(10) Patent No.: US 12,677,612 B2
(45) Date of Patent: *Jul. 7, 2026

(54) METHOD OF PROCESSING SUBSTRATE, METHOD OF MANUFACTURING SEMICONDUCTOR DEVICE, SUBSTRATE PROCESSING APPARATUS, AND RECORDING MEDIUM

(71) Applicant: Kokusai Electric Corporation, Tokyo (JP)

(72) Inventors: Atsushi Sano, Toyama (JP); Kenji Kameda, Toyama (JP); Yushin Takasawa, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 399 days.

This patent is subject to a terminal disclaimer.

(21) Appl. No.: 18/344,181

(22) Filed: Jun. 29, 2023

(65) Prior Publication Data

US 2023/0343580 A1     Oct. 26, 2023

Related U.S. Application Data

(63) Continuation of application No. 15/900,393, filed on Feb. 20, 2018, now Pat. No. 11,735,412.

(30) Foreign Application Priority Data

Feb. 22, 2017     (JP) ................................. 2017-031299

(51) Int. Cl.
| | |
|---|---|
| *H01L 21/02* | (2006.01) |
| *C23C 16/30* | (2006.01) |
| *C23C 16/36* | (2006.01) |
| *C23C 16/455* | (2006.01) |
| *H10P 14/60* | (2026.01) |
| *H10P 14/692* | (2026.01) |

(52) U.S. Cl.
CPC ........ *H10P 14/6922* (2026.01); *C23C 16/308* (2013.01); *C23C 16/36* (2013.01);
(Continued)

(58) Field of Classification Search
None
See application file for complete search history.

(56) References Cited

U.S. PATENT DOCUMENTS

| | | | |
|---|---|---|---|
| 8,647,722 B2 | 2/2014 | Kobayashi et al. | |
| 9,837,270 B1 | 12/2017 | Varadarajan et al. | |

(Continued)

FOREIGN PATENT DOCUMENTS

| | | |
|---|---|---|
| CN | 104081505 A | 10/2014 |
| JP | 2006-351694 A | 12/2006 |

(Continued)

OTHER PUBLICATIONS

Korean Office Action, Korean Patent Application No. 10-2018-0019830, Feb. 11, 2019.
(Continued)

*Primary Examiner* — Asok K Sarkar
(74) *Attorney, Agent, or Firm* — Volpe Koenig

(57) ABSTRACT

There is provided a technique which includes: forming a first film containing silicon, oxygen, carbon and nitrogen on a substrate by performing a first cycle a predetermined number of times, the first cycle including forming a first layer containing silicon, oxygen, carbon and nitrogen by supplying a first precursor containing silicon, nitrogen and carbon and an oxidant to the substrate, and performing a first modifying process to the first layer at a first temperature to desorb impurities contained in the first layer and densify the first layer; and performing, after forming the first film, a second modifying process to the first film at a second temperature that is not less than the first temperature to (Continued)

desorb impurities contained in the first film and densify the first film.

24 Claims, 11 Drawing Sheets

(52) U.S. Cl.
CPC .. *C23C 16/45527* (2013.01); *C23C 16/45546* (2013.01); *H10P 14/6339* (2026.01); *H10P 14/6528* (2026.01); *H10P 14/6529* (2026.01); *H10P 14/662* (2026.01); *H10P 14/6682* (2026.01); *H10P 14/6686* (2026.01); *H10P 14/6687* (2026.01)

(56) References Cited

U.S. PATENT DOCUMENTS

| | | | | |
|---|---|---|---|---|
| 11,735,412 | B2 * | 8/2023 | Sano | H01L 21/02334 438/763 |
| 2006/0278952 | A1 | 12/2006 | Mori et al. | |
| 2006/0286820 | A1 | 12/2006 | Singh et al. | |
| 2012/0225565 | A1 | 9/2012 | Bhatia et al. | |
| 2013/0196516 | A1 | 8/2013 | Lavoie et al. | |
| 2014/0051262 | A9 | 2/2014 | Lavoie et al. | |
| 2014/0287595 | A1 | 9/2014 | Shimamoto et al. | |
| 2015/0232992 | A1 | 8/2015 | Kim et al. | |

FOREIGN PATENT DOCUMENTS

| | | |
|---|---|---|
| JP | 2009-516906 A | 4/2009 |
| JP | 2015-510263 A | 4/2015 |
| KR | 20100036186 A | 4/2010 |
| KR | 20140015421 A | 2/2014 |

OTHER PUBLICATIONS

Japanese Office Action, Japanese Patent Application No. 2017-031299, Jun. 16, 2020.
Chinese Office Action, Chinese Patent Application No. 201810150065. 2, Aug. 31, 2020.

* cited by examiner

METHOD OF PROCESSING SUBSTRATE, METHOD OF MANUFACTURING SEMICONDUCTOR DEVICE, SUBSTRATE PROCESSING APPARATUS, AND RECORDING MEDIUM

CROSS-REFERENCE TO RELATED APPLICATIONS

This application is a continuation of U.S. patent application Ser. No. 15/900,393, filed Feb. 20, 2018, which is based upon and claims the benefit of priority from Japanese Patent Application No. 2017-031299, filed on Feb. 22, 2017, the entire contents of which are incorporated herein by reference.

TECHNICAL FIELD

The present disclosure relates to a method of manufacturing a semiconductor device, a substrate processing apparatus, and a recording medium.

BACKGROUND

As one of processes of manufacturing a semiconductor device, a process of forming a silicon oxycarbonitride film (SiOCN film) containing silicon (Si), oxygen (O), carbon (C) and nitrogen (N) on a substrate by supplying aminosilane and an oxidant to the substrate is often carried out.

SUMMARY

Some embodiments of the present disclosure provide a technique capable of improving the film quality of a SiOCN film formed on a substrate.

According to one embodiment of the present disclosure, there is provided a method of manufacturing a semiconductor device. The method of manufacturing the semiconductor device includes: forming a first film containing silicon, oxygen, carbon, and nitrogen on a substrate by performing a first cycle a predetermined number of times, the first cycle including non-simultaneously performing: forming a first layer containing silicon, oxygen, carbon and nitrogen by simultaneously supplying first aminosilane and an oxidant to the substrate; and performing a first modifying process to the first layer under a first temperature; and performing a second modifying process to the first film under a second temperature that is higher than the first temperature.

BRIEF DESCRIPTION OF DRAWINGS

FIG. 1 is a schematic configuration view of a vertical processing furnace of a substrate processing apparatus suitably used in an embodiment of the present disclosure, in which a portion of the processing furnace is illustrated in a vertical cross-sectional view.

FIG. 8 is a diagram showing results of evaluation on film quality.

DETAILED DESCRIPTION

One Embodiment of the Present Disclosure

Figure 2:
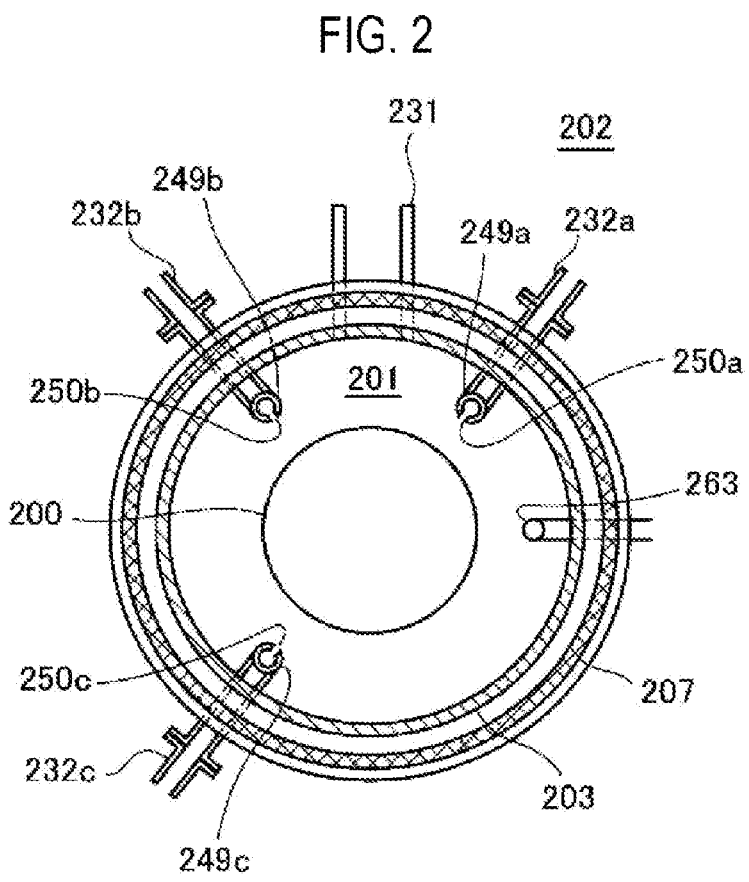
FIG. 2 is a schematic configuration view of the vertical processing furnace of the substrate processing apparatus suitably used in an embodiment of the present disclosure, in which a portion of the processing furnace is illustrated in a cross-sectional view taken along the line A-A in FIG. 1.

One embodiment of the present disclosure will now be described with reference to FIGS. 1 to 3.

(1) Configuration of Substrate Processing Apparatus

Figure 1:
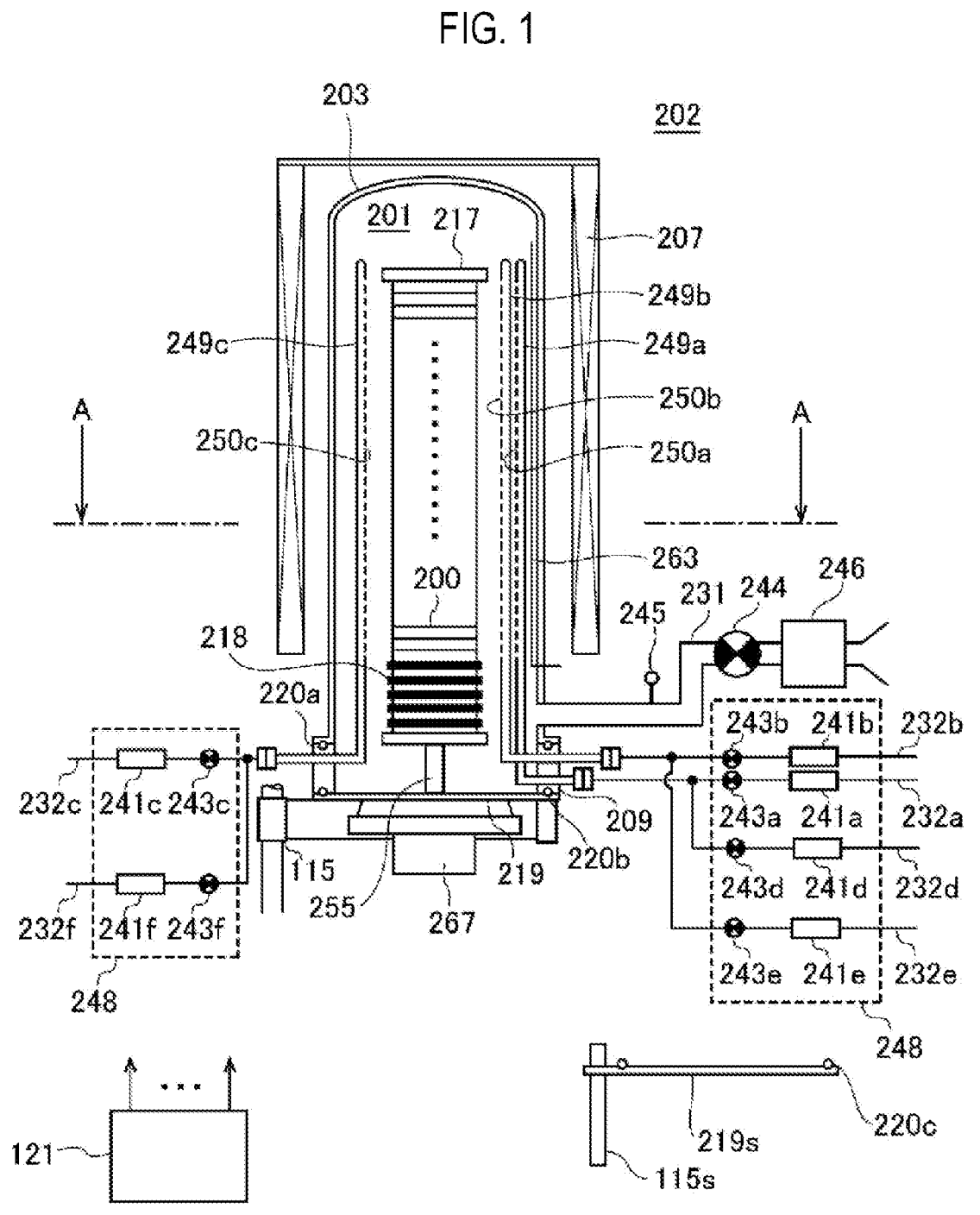

As illustrated in FIG. 1, a processing furnace 202 includes a heater 207 as a heating mechanism (a temperature adjustment part). The heater 207 has a cylindrical shape and is supported by a support plate so as to be vertically installed. The heater 207 also functions as an activation mechanism (an excitation part) configured to thermally activate (excite) gas.

A reaction tube 203 is disposed inside the heater 207 to be concentric with the heater 207. The reaction tube 203 is made of, for example, a heat resistant material such as quartz (SiO$_2$), silicon carbide (SiC) or the like, and has a cylindrical shape with its upper end closed and its lower end opened. A manifold 209 is disposed to be concentric with the reaction tube 203 under the reaction tube 203. The manifold 209 is made of, for example, a metal material such as stainless steel (SUS: Steel Use Stainless) or the like, and has a cylindrical shape with both of its upper and lower ends opened. The upper end portion of the manifold 209 engages with the lower end portion of the reaction tube 203 so as to support the reaction tube 203. An O-ring 220a serving as a seal member is installed between the manifold 209 and the reaction tube 203. Similar to the heater 207, the reaction tube 203 is vertically installed. A process vessel (reaction vessel) mainly includes the reaction tube 203 and the manifold 209. A process chamber 201 is formed in a hollow cylindrical portion of the process vessel. The process chamber 201 is configured to accommodate a plurality of wafers 200 as substrates.

Nozzles 249a to 249c are installed in the process chamber 201 so as to penetrate through a sidewall of the manifold 209. Gas supply pipes 232a to 232c are connected to the nozzles 249a to 249c, respectively.

Mass flow controllers (MFCs) 241a to 241c, which are flow rate controllers (flow rate control parts), and valves 243a to 243c, which are opening/closing valves, are installed to the gas supply pipes 232a to 232c, respectively, sequentially from upstream sides of the gas supply pipes 232a to 232c. Gas supply pipes 232d to 232f, which supply inert gas, are connected to the gas supply pipes 232a to 232c, respectively, at downstream sides of the valves 243a to 243c. MFCs 241d to 241f and valves 243d to 243f are installed to the gas supply pipes 232d to 232f, respectively, sequentially from upstream sides of the gas supply pipes 232d to 232f.

As illustrated in FIG. 2, each of the nozzles 249a to 249c is disposed in an annular space (in a plane view) between an inner wall of the reaction tube 203 and the wafers 200 so as to extend upward along a stack direction of the wafers 200 from a lower portion of the inner wall of the reaction tube 203 to an upper portion thereof. Specifically, each of the nozzles 249a to 249c is installed in a region horizontally surrounding a wafer arrangement region in which the wafers 200 are arranged at a lateral side of the wafer arrangement region, along the wafer arrangement region. Gas supply holes 250a to 250c for supplying gas are formed on side surfaces of the nozzles 249a to 249c, respectively. Each of the gas supply holes 250a to 250c is opened toward a center of the reaction tube 203 to allow the gas to be supplied toward the wafers 200. A plurality of gas supply holes 250a to 250c may be installed from a lower portion of the reaction tube 203 to an upper portion of the reaction tube 203.

As a precursor (precursor gas), aminosilane (first aminosilane) containing Si, N and C is supplied from the gas supply pipe 232a into the process chamber 201 via the MFC 241a, the valve 243a, and the nozzle 249a. The precursor gas refers to a gaseous precursor, for example, a precursor which remains in a gas state under room temperature and atmospheric pressure, or gas obtained by vaporizing a precursor which remains in a liquid state under room temperature and atmospheric pressure. An example of the first aminosilane may include bis(diethylamino)silane ($SiH_2[N(C_2H_5)_2]_2$, abbreviation: BDEAS) gas.

As a precursor (precursor gas), second aminosilane that is different from the first aminosilane or alkoxysilane is supplied from the gas supply pipe 232b into the process chamber 201 via the MFC 241b, the valve 243b and the nozzle 249b. An example of the second aminosilane may include tris(dimethylamino)silane ($SiH[N(CH_3)_2]_3$, abbreviation: 3DMAS) gas. The alkoxysilane is silane containing an alkoxy group, that is, a functional group formed by bonding of an alkyl group (R) with oxygen (O). An example of the alkoxysilane may include methyltrimethoxysilane ($(CH_3O)_3SiCH_3$) gas.

As a reactant (reaction gas), an O-containing gas (oxidant) is supplied from the gas supply pipe 232c into the process chamber 201 via the MFC 241c, the valve 243c, and the nozzle 249c. An example of the O-containing gas may include nitrous oxide ($N_2O$) gas which is a nitrogen oxide-based gas.

An inert gas, for example, nitrogen ($N_2$) gas, is supplied from the gas supply pipes 232d to 232f into the process chamber 201 via the MFCs 241d to 241f, the valves 243d to 243f, the gas supply pipes 232a to 232c, and the nozzles 249a to 249c, respectively. The $N_2$ gas acts as a purge gas or a carrier gas.

A first supply system (first aminosilane supply system) mainly includes the gas supply pipe 232a, the MFC 241a, and the valve 243a. A second supply system (second aminosilane or alkoxysilane supply system) mainly includes the gas supply pipe 232b, the MFC 241b, and the valve 243b. A third supply system (oxidant supply system) mainly includes the gas supply pipe 232c, the MFC 241c, and the valve 243c. An inert gas supply system mainly includes the gas supply pipes 232d to 232f, the MFCs 241d to 241f, and the valves 243d to 243f.

One or all of the above-described various supply systems may be configured as an integrated-type supply system 248 in which the valves 243a to 243f, the MFCs 241a to 241f and so on are integrated. The integrated-type supply system 248 is connected to each of the gas supply pipes 232a to 232f. In addition, the integrated-type supply system 248 may be configured such that operations of suppling various gases into the gas supply pipes 232a to 232f (that is, opening/closing operation of the valves 243a to 243f, flow rate adjustment operation by the MFCs 241a to 241f, and the like) are controlled by a controller 121 which will be described later. The integrated-type supply system 248 is configured as an integral type or detachable-type integrated unit, and may be attached to and detached from the gas supply pipes 232a to 232f and the like on an integrated unit basis, so that the maintenance, replacement, extension, etc. of the integrated-type supply system 248 can be performed on an integrated unit basis.

An exhaust pipe 231 for exhausting an internal atmosphere of the process chamber 201 is installed below a sidewall of the reaction tube 203. A vacuum pump 246, as a vacuum-exhausting device, is connected to the exhaust pipe 231 via a pressure sensor 245, which is a pressure detector (pressure detecting part) for detecting an internal pressure of the process chamber 201, and an auto pressure controller (APC) valve 244, which is a pressure regulator (pressure adjustment part). The APC valve 244 is configured to perform or stop a vacuum-exhausting operation in the process chamber 201 by opening or closing the valve while the vacuum pump 246 is actuated, and is also configured to adjust the internal pressure of the process chamber 201 by adjusting an opening degree of the valve based on pressure information detected by the pressure sensor 245 while the vacuum pump 246 is actuated. An exhausting system mainly includes the exhaust pipe 231, the APC valve 244, and the pressure sensor 245. The exhausting system may include the vacuum pump 246.

A seal cap 219, which serves as a furnace opening cover configured to hermetically seal a lower end opening of the manifold 209, is installed under the manifold 209. The seal cap 219 is made of, for example, a metal material such as stainless steel (SUS) or the like, and is formed in a disc shape. An O-ring 220b, which is a seal member making contact with the lower end portion of the manifold 209, is installed on an upper surface of the seal cap 219. A rotation mechanism 267 configured to rotate a boat 217, which will be described later, is installed under the seal cap 219. A rotary shaft 255 of the rotation mechanism 267, which penetrates through the seal cap 219, is connected to the boat 217. The rotation mechanism 267 is configured to rotate the wafers 200 by rotating the boat 217. The seal cap 219 is configured to be vertically moved up and down by a boat elevator 115 which is an elevator mechanism installed outside the reaction tube 203. The boat elevator 115 is configured as a transfer device (transfer mechanism) which loads/unloads (transfers) the wafers 200 into/out of the process chamber 201 by moving the seal cap 219 up and down. In addition, a shutter 219s, which serves as a furnace opening cover configured to hermetically seal a lower end opening of the manifold 209 in a state where the seal cap 219 is lowered, and the boat 217 is unloaded from the process chamber 201, is installed under the manifold 209. The shutter 219s is made of, for example, a metal material such as stainless steel (SUS) or the like, and is formed in a disc shape. An O-ring 220c, which is a seal member making contact with the lower end portion of the manifold 209, is installed on an upper surface of the shutter 219s. The opening/closing operation (such as elevation operation, rotation operation or the like) of the shutter 219s is controlled by a shutter opening/closing mechanism 115s.

The boat 217 serving as a substrate support is configured to support a plurality of wafers 200, for example, 25 to 200 wafers, in such a state that the wafers 200 are arranged in a horizontal posture and in multiple stages along a vertical direction with the centers of the wafers 200 aligned with one another. As such, the boat 217 is configured to arrange the wafers 200 to be spaced apart from each other. The boat 217 is made of a heat resistant material such as quartz or SiC. Heat insulating plates 218 made of a heat resistant material such as quartz or SiC are installed below the boat 217 in multiple stages.

A temperature sensor 263 serving as a temperature detector is installed in the reaction tube 203. Based on temperature information detected by the temperature sensor 263, a state of supplying electric power to the heater 207 is adjusted such that an interior of the process chamber 201 has a desired temperature distribution. The temperature sensor 263 is installed along the inner wall of the reaction tube 203.

Figure 3:
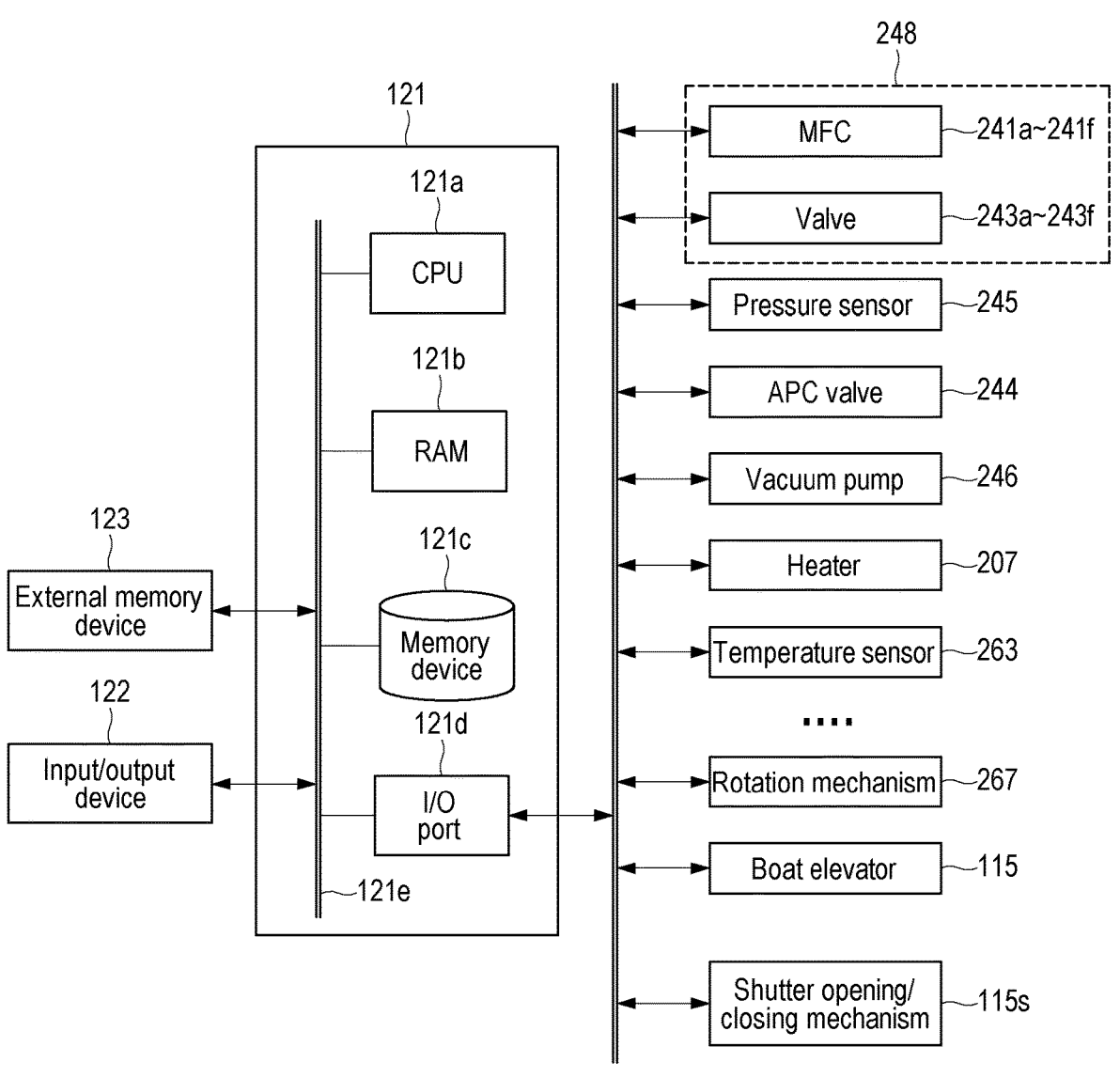
FIG. 3 is a schematic configuration diagram of a controller of the substrate processing apparatus suitably used in an embodiment of the present disclosure, in which a control system of the controller is illustrated in a block diagram.

As illustrated in FIG. 3, a controller 121, which is a control part (control part), may be configured as a computer including a central processing unit (CPU) 121a, a random access memory (RAM) 121b, a memory device 121c, and an I/O port 121d. The RAM 121b, the memory device 121c, and the I/O port 121d are configured to exchange data with the CPU 121a via an internal bus 121e. An input/output device 122 formed of, e.g., a touch panel or the like, is connected to the controller 121.

The memory device 121c is configured by, for example, a flash memory, a hard disk drive (HDD) or the like. A control program for controlling operations of a substrate processing apparatus and a process recipe, in which sequences and conditions of a film forming process to be described later are written, are readably stored in the memory device 121c. The process recipe functions as a program for causing the controller 121 to execute each sequence in the film forming process, which will be described later, to obtain an expected result. Hereinafter, the process recipe and the control program may be generally and simply referred to as a "program." Furthermore, the process recipe may be simply referred to as a "recipe." When the term "program" is used herein, it may indicate a case of including the recipe, a case of including the control program, or a case of including both the recipe and the control program. In addition, the RAM 121b is configured as a memory area (work area) in which a program or data read by the CPU 121a is temporarily stored.

The I/O port 121d is connected to the MFCs 241a to 241f, the valves 243a to 243f, the pressure sensor 245, the APC valve 244, the vacuum pump 246, the temperature sensor 263, the heater 207, the rotation mechanism 267, the boat elevator 115, the shutter opening/closing mechanism 115s and the like.

The CPU 121a is configured to read and execute the control program from the memory device 121c. The CPU 121a also reads the recipe from the memory device 121c according to an input of an operation command from the input/output device 122. In addition, the CPU 121a is configured to control the flow rate adjustment operation of various kinds of gases by the MFCs 241a to 241f, the opening/closing operation of the valves 243a to 243f, the opening/closing operation of the APC valve 244, the pressure adjusting operation performed by the APC valve 244 based on the pressure sensor 245, the actuating and stopping of the vacuum pump 246, the temperature adjustment operation performed by the heater 207 based on the temperature sensor 263, the operation of rotating the boat 217 with the rotation mechanism 267 and adjusting the rotation speed of the boat 217, the operation of moving the boat 217 up and down by the boat elevator 115, the opening/closing operation of the shutter 219s by the shutter opening/closing mechanism 115s and the like, according to contents of the read recipe.

The controller 121 may be configured by installing, on the computer, the aforementioned program stored in an external memory device 123 (for example, a magnetic disk such as an HDD, an optical disc such as a CD, a magneto-optical disc such as an MO, a semiconductor memory such as a USB memory). The memory device 121c or the external memory device 123 is configured as a non-transitory computer-readable recording medium. Hereinafter, the memory device 121c and/or the external memory device 123 may be generally and simply referred to as a "recording medium." When the term "recording medium" is used herein, it may indicate a case of including the memory device 121c, a case of including the external memory device 123, or a case of including both the memory device 121c and the external memory device 123. Furthermore, the program may be provided to the computer using communication means such as the Internet or a dedicated line, instead of using the external memory device 123.

(2) Film Forming Process

A sequence example of forming a film on a wafer 200 as a substrate using the aforementioned substrate processing apparatus, which is one of the processes for manufacturing a semiconductor device, will be described with reference to FIG. 4A. In the following descriptions, the operations of the respective parts constituting the substrate processing apparatus are controlled by the controller 121.

Figure 4A:
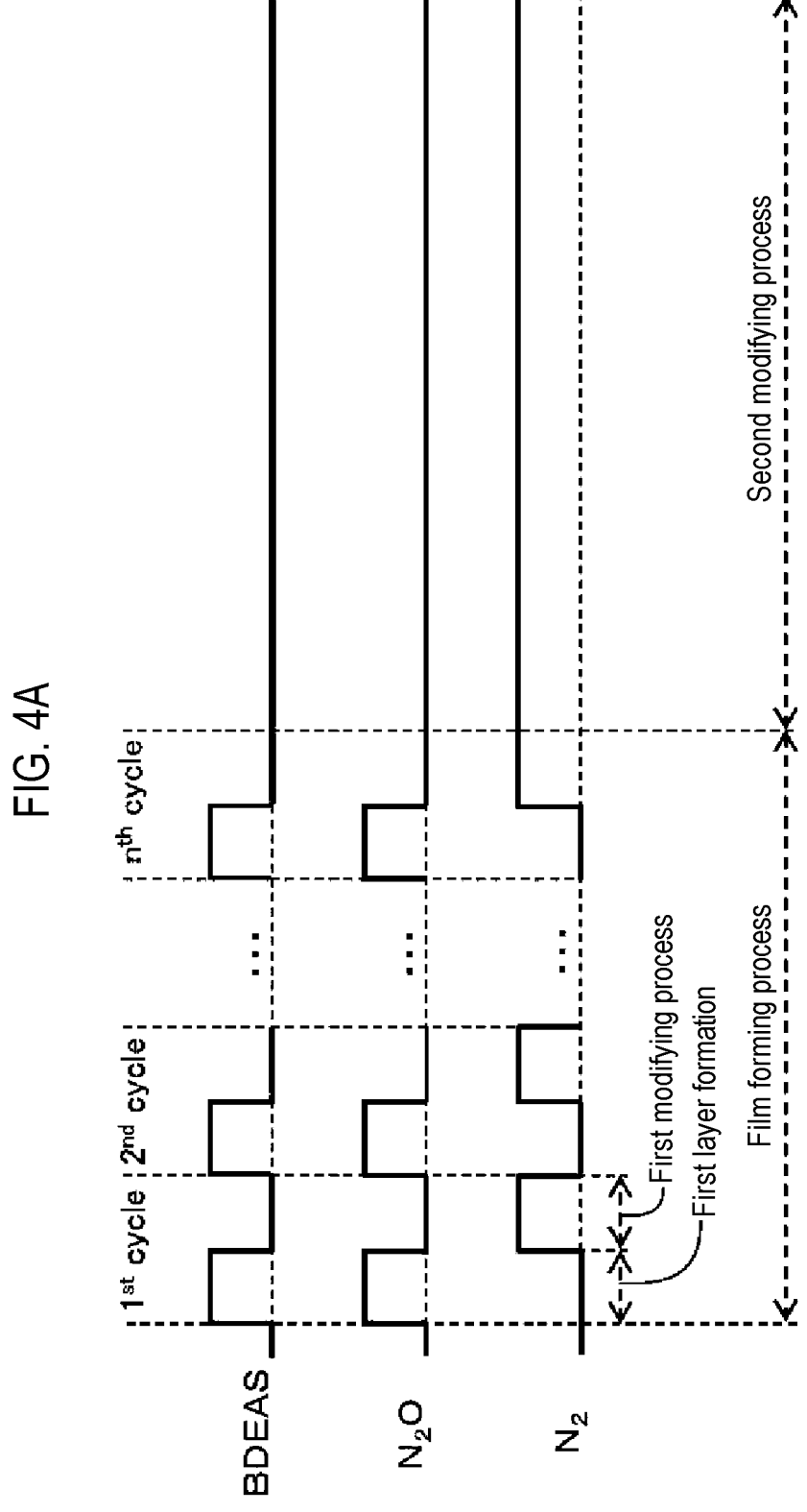
FIG. 4A is a diagram showing a film forming sequence according to an embodiment of the present disclosure and FIG. 4B shows a modification thereof.

The film forming sequence illustrated in FIG. 4A includes a step of forming a first film containing Si, O, C, and N on a wafer 200 by performing a cycle a predetermined number of times, the cycle including non-simultaneously performing: forming a first layer containing Si, O, C and N by simultaneously supplying BDEAS gas and $N_2O$ gas to the wafer 200 and performing a first modifying process to the first layer under a first temperature; and performing a second modifying process to the first film under a second temperature that is higher than the first temperature.

In the present disclosure, for the sake of convenience, the film forming sequence illustrated in FIG. 4A may be denoted as follows. The same denotation may be used in modifications to be described later.

$$(BDEAS+N_2O \rightarrow 1st \ anneal) \times n \rightarrow 2nd \ anneal \Rightarrow SiOCN$$

When the term "wafer" is used in the present disclosure, it may refer to "a wafer itself" or "a wafer and a laminated body of certain layers or films formed on a surface of the wafer." When the phrase "a surface of a wafer" is used in the present disclosure, it may refer to "a surface of a wafer itself" or "a surface of a certain layer formed on a wafer". When the expression "a certain layer is formed on a wafer" is used in the present disclosure, it may mean that "a certain layer is formed directly on a surface of a wafer itself" or that "a certain layer is formed on a layer formed on a wafer." When the term "substrate" is used in the present disclosure, it may be synonymous with the term "wafer."

(Wafer Charging and Boat Loading)

When a plurality of wafers 200 are charged on the boat 217 (wafer charging), the shutter 219s is moved by the shutter opening/closing mechanism 115s and the lower end opening of the manifold 209 is opened (shutter open). Then, as illustrated in FIG. 1, the boat 217 supporting the plurality of wafers 200 is lifted up by the boat elevator 115 to be loaded into the process chamber 201 (boat loading). In this state, the seal cap 219 seals the lower end of the manifold 209 through the O-ring 220b.

(Pressure Adjustment and Temperature Adjustment)

The interior of the process chamber 201, namely, a space in which the wafers 200 are placed, is vacuum-exhausted (depressurization-exhausted) by the vacuum pump 246 to reach a desired pressure (degree of vacuum). In this operation, the internal pressure of the process chamber 201 is measured by the pressure sensor 245. The APC valve 244 is feedback-controlled based on the measured pressure information. The wafers 200 in the process chamber 201 are heated by the heater 207 to a desired processing temperature (first temperature). In this operation, the state of supplying electric power to the heater 207 is feedback-controlled based on the temperature information detected by the temperature sensor 263 such that the interior of the process chamber 201 has a desired temperature distribution. The rotation of the wafers 200 by the rotation mechanism 267 is then initiated. Exhausting the interior of the process chamber 201 and heating and rotating the wafers 200 may be continuously performed at least until processing of the wafers 200 is completed.

(Film Forming Step)

The following Steps 1 and 2 are then performed in a sequential manner.

[Step 1]

In this step, BDEAS gas and $N_2O$ gas are simultaneously supplied to the wafer 200 in the process chamber 201.

More specifically, the valves 243a and 243c are opened to allow the BDEAS gas and the $N_2O$ gas to flow through the gas supply pipes 232a and 232c, respectively. Flow rates of the BDEAS gas and the $N_2O$ gas are adjusted by the MFCs 241a and 241c, respectively; and then the BDEAS gas and the $N_2O$ gas are supplied into the process chamber 201 via the nozzles 249a and 249c, respectively, are mixed in the process chamber 201, and are exhausted through the exhaust pipe 231. In this operation, the BDEAS gas and the $N_2O$ gas are supplied to the wafer 200, and the valves 243d to 243f may be opened to allow $N_2$ gas to flow through the gas supply pipes 232d to 232f, respectively.

By simultaneously supplying the BDEAS gas and the $N_2O$ gas to the wafer 200, a first layer (initial layer), for example, a layer containing Si, O, C, and N and having a thickness of several atomic layers to several tens atomic layers, that is, a SiOCN layer, is formed (deposited) on the outermost surface of the wafer 200.

[Step 2]

After first Step 1 is completed, a modifying process (first modifying process) is performed to the first layer formed on the wafer 200 under the first temperature. More specifically, the valves 243a and 243c are closed to stop the supply of the BDEAS gas and the $N_2O$ gas into the process chamber 201, respectively. In addition, the valves 243d to 243f are opened to supply the $N_2$ gas into the process chamber 201 via the nozzles 249a to 249c, that is, supply the $N_2$ gas to the wafer 200.

By performing the first modifying process, impurities (first impurities) contained in the first layer can be desorbed from the first layer. In addition, by performing the first modifying process, it is possible to shorten the interatomic distance of atoms constituting the first layer, that is, to densify the first layer. Further, by setting a thickness of the first layer formed in Step 1 to a predetermined thickness within the above-mentioned range, it is possible to apply the first modifying process to an entire region of the first layer in a thickness direction. As a result, it is possible to change (modify) the first layer into a dense layer with fewer impurities over the entire region of the first layer in the thickness direction.

(Performing Predetermined Number of Times)

A cycle that non-simultaneously (i.e., asynchronously) performs Steps 1 and 2 is performed a predetermined number of times (n times, n being an integer of one or more) to thereby form a SiOCN film having a predetermined composition and a predetermined film thickness on the wafer 200. This cycle may be repeated multiple times. That is to say, a thickness of the first layer formed per one cycle may be set to be smaller than a desired film thickness. Thus, the above cycle may be repeated multiple times until a film thickness of the film formed by laminating the first layers becomes equal to the desired film thickness.

The process conditions of Step 1 are exemplified as follows.

Processing temperature (first temperature): 500 to 650 degrees C., specifically 600 to 650 degrees C.

Processing pressure: 0.2 to 20 Torr (26.6 to 2660 Pa), specifically 0.5 to 2 Torr (66.5 to 266 Pa)

BDEAS gas supply flow rate: 1 to 1,000 sccm, specifically 50 to 100 sccm $N_2O$ gas supply flow rate: 100 to 3,000 sccm, specifically 500 to 2,000 sccm $N_2$ gas supply flow rate: 0 to 1,000 sccm Gas supply time: 60 to 300 seconds, specifically 60 to 120 seconds.

The processing pressure in Step 1 may be lower than the processing pressure in Step 2, specifically lower than the processing pressure in a second modifying step to be described later.

The process conditions of Step 2 are exemplified as follows.

Processing temperature (first temperature): 500 to 650 degrees C., specifically 600 to 650 degrees C.

Processing pressure: 0.2 to 760 Torr (26.6 to 101,080 Pa), specifically 0.5 to 2 Torr (66.5 to 266 Pa)

$N_2$ gas supply flow rate: 1,000 to 5,000 sccm

Gas supply time: 60 to 300 seconds, specifically 60 to 120 seconds

The processing pressure in Step 2 may be lower than the processing pressure in the second modifying step to be described later.

If the processing temperature is greater than 650 degrees C. in Step 1, the BDEAS supplied into the process chamber 201 is excessively decomposed, which may cause excessive gas phase reaction in the process chamber 201, resulting in deterioration of the wafer in-plane film thickness uniformity and step coverage of the finally formed first film. By setting the processing temperature at the temperature of 650 degrees C. or lower, it is possible to improve the wafer in-plane film thickness uniformity and the like of the first film.

If the processing temperature is lower than 500 degrees C. in Step 2, the modifying effect on the first layer may not be obtained in some cases. By setting the processing temperature at the temperature of 500 degrees C. or higher, the modifying effect on the first layer can be obtained. By setting the processing temperature at a temperature of 600 degrees C. or higher, it is possible to enhance the modifying effect on the first layer.

Examples of the first aminosilane may include monoaminosilane ($SiH_3R$), triaminosilane ($SiHRR'R''$), and tetraaminosilane ($SiRR'R''R'''$), besides diaminosilane ($SiH_2RR'$) such as the BDEAS gas. Here, each of R, R', R'' and R''' represents an organic group. In this embodiment, the organic group is, for example, an amino group in which one or two hydrocarbon groups containing one or more C atoms are coordinated with one N atom. In the case where two hydrocarbon groups constituting a part of the amino group are coordinated with one N atom, the two hydrocarbon groups may be the same or different. In addition, the hydrocarbon group may contain an unsaturated bond such as a double bond or a triple bond. Further, the amino groups of R, R', R" and R'" may be the same or different. Further, the amino groups may have a cyclic structure.

Examples of the monoaminosilane may include (ethylm-ethylamino) silane $(SiH_3[N(CH_3)(C_2H_5)]$, abbreviation: EMAS) gas, (dimethylamino) silane $(SiH_3[N(CH_3)_2]$, abbreviation: DMAS) gas or the like.

Example of the diaminosilane may include bis(tert-buty-lamino)silane $(SiH_2[NH(C_4H_9)_2]$, abbreviation: BTBAS) gas, bis(diethylpiperidino)silane $(SiH_2[NC_5H_8)(C_2H_5)_2]_2$, abbreviation: BDEPS) gas or the like, in addition to the BDEAS gas.

Example of the triaminosilane may include tris(diethyl-amino)silane $(SiH[N(C_2H_5)_2]_3$, abbreviation: 3DEAS) gas, 3DMAS gas or the like.

Examples of the tetraaminosilane may include tetrakis (diethylamino)silane $(Si[N(C_2H_5)_2]_4$, abbreviation: 4DEAS) gas, tetrakis(dimethylamino)silane $(Si[N(CH_3)_2]_4$, abbreviation: 4DMAS) gas or the like.

Example of the oxidant may include nitrogen monoxide (NO) gas, carbon dioxide $(CO_2)$ gas, carbon monoxide (CO) gas, oxygen $(O_2)$ gas, water vapor $(H_2O$ gas), ozone $(O_3)$ gas or the like, in addition to the $N_2O$ gas. By using a nitrogen oxide-based gas such as the $N_2O$ gas or the NO gas as the oxidant, the above-described modifying process can be performed softly. As a result, it becomes easier to leave a C component and an N component in the finally formed SiOCN film, thereby improving the electric characteristics and processing resistance of the film. In particular, when the $N_2O$ gas is used as the oxidant, the above-described effects can be more easily obtained than the case of using the NO gas.

Example of the inert gas may include a rare gas such as Ar gas, He gas, Ne gas, Xe gas or the like, in addition to the $N_2$ gas.

(Second Modifying Step)

After the first film is formed on the wafer 200, the temperature of the wafer 200 is raised. That is to say, the temperature of the wafer 200 is changed (raised) to a second temperature that is higher than the above-mentioned first temperature. Then, the first film formed on the wafer 200 is subjected to a modifying process (second modifying pro-cess) under the second temperature. This step is performed in a state where the atmosphere in the process chamber 201 is set to an oxygen-free atmosphere. For example, this step may be performed in a state where the supply of BDEAS gas and $N_2O$ gas to the wafer 200 is not carried out and the supply of $N_2$ gas is carried out, according to the same processing procedure as that in above-described Step 2.

By performing the second modifying process, it is pos-sible to desorb impurities contained in the first film from the first film so that the first film can be changed (modified) to a more dense film with fewer impurities. In addition, since the second modifying process is performed in a state where the temperature of the wafer 200 is heated to the second temperature that is higher than the first temperature, it is possible to remove impurities (second impurities), which could not be removed by the first modifying process, from the first film.

The process conditions of this step are exemplified as follows.

Processing temperature (second temperature): 700 to 800 degrees C.

Processing pressure: 0.5 to 760 Torr (66.5 to 101,080 Pa), specifically 0.5 to 100 Torr (66.5 to 13,300 Pa)

$N_2$ gas supply flow rate: 1,000 to 5,000 sccm

Gas supply time: 10 to 60 minutes

If the processing temperature is lower than 700 degrees C., the modifying effect on the first film may not be obtained in some cases. By setting the processing temperature at a temperature of 700 degrees C. or higher, the modifying effect on the first film can be obtained. If the processing temperature is more than 800 degrees C., it takes time to raise the temperature of the interior of the process chamber 201, which may lead to poor productivity of substrate processing. By setting the processing temperature at the temperature of 800 degrees C. or lower, it is possible to avoid reduction in the productivity of substrate processing and it is also possible to manage a thermal history of the wafer 200 well.

However, if a technique such as RTA (Rapid Thermal Anneal) is used, it is possible to perform the second modi-fying process even under a high temperature of 800 degrees C. or higher, for example, 800 to 1,200 degrees C., without affecting the productivity and so on. In this case, for example, the processing time is as short as about 1 to 60 seconds. Even in this case, the same effects as described above can be obtained.

(After-Purging and Returning to Atmospheric Pressure)

After the second modifying process is completed, $N_2$ gas as a purge gas is supplied into the process chamber 201 from each of the gas supply pipes 232d to 232f and is exhausted through the exhaust pipe 231. Thus, the interior of the process chamber 201 is purged and the residual gas and the reaction byproducts remaining in the process chamber 201 are removed from the interior of the process chamber 201 (after-purge). The internal atmosphere of the process cham-ber 201 is then substituted with inert gas (inert gas substi-tution) and the internal pressure of the process chamber 201 is returned to an atmospheric pressure (return to atmospheric pressure).

(Boat Unload and Wafer Discharge)

The seal cap 219 is then moved down by the boat elevator 115 to open the lower end of the manifold 209. In addition, the processed wafers 200 supported by the boat 217 are unloaded from the lower end of the manifold 209 to the outside of the reaction tube 203 (boat unload). After the boat unloading, the shutter 219s is moved, and the lower end opening of the manifold 209 is sealed by the shutter 219s through the O-ring 220c (shutter close). The processed wafers 200 are discharged from the boat 217 (wafer dis-charge), after being unloaded from the reaction tube 203.

(3) Effects According to the Present Embodiment

According to the present embodiment, one or more effects set forth below may be achieved.

(a) By intermittently performing the first modifying pro-cess during the film forming process, it is possible to make the first film formed on the wafer 200 a dense film with fewer impurities over the entire region of the first film in the thickness direction. Thus, the first film formed by performing the film forming process can have a low dielectric constant and good processing resistance (characteristics) such as ashing resistance or hydrogen fluoride (HF) resistance.

(b) By performing the second modifying process after the film forming process, it is possible to desorb the second impurities, which could not be removed by the first modifying process, from the first film, thereby further densifying the first film. As such, by a two-step modifying (two-step annealing) process including the first modifying process under the first temperature and the second modifying process under the second temperature that is higher than the first temperature, which are performed in that order, it is possible to make the finally formed first film a film with a lower dielectric constant and better processing resistance.

(c) By using aminosilane (e.g., BDEAS gas) containing Si, C, and N as a precursor, it is easy to add a C component and an N component to the finally formed first film. As a result, it is possible to make the finally formed first film a film containing C and N at high concentrations, that is, a film with excellent processing resistance.

(d) By using a nitrogen oxide-based gas (e.g., $N_2O$ gas) having a relatively weak oxidizing power as a reactant, it is easy to leave a C component and an N component in the finally formed first film. As a result, it is possible to form the finally formed first film a film containing C and N at high concentrations, that is, a film with excellent processing resistance.

(e) The above-described effects can be obtained in the same manner when aminosilane other than the BDEAS gas is used, an oxidant other than the $N_2O$ gas is used, or an inert gas other than the $N_2$ gas is used.

(4) Modifications

The present embodiment may be changed to the following modifications which may be used in proper combination.
(First Modification)

Figure 4B:
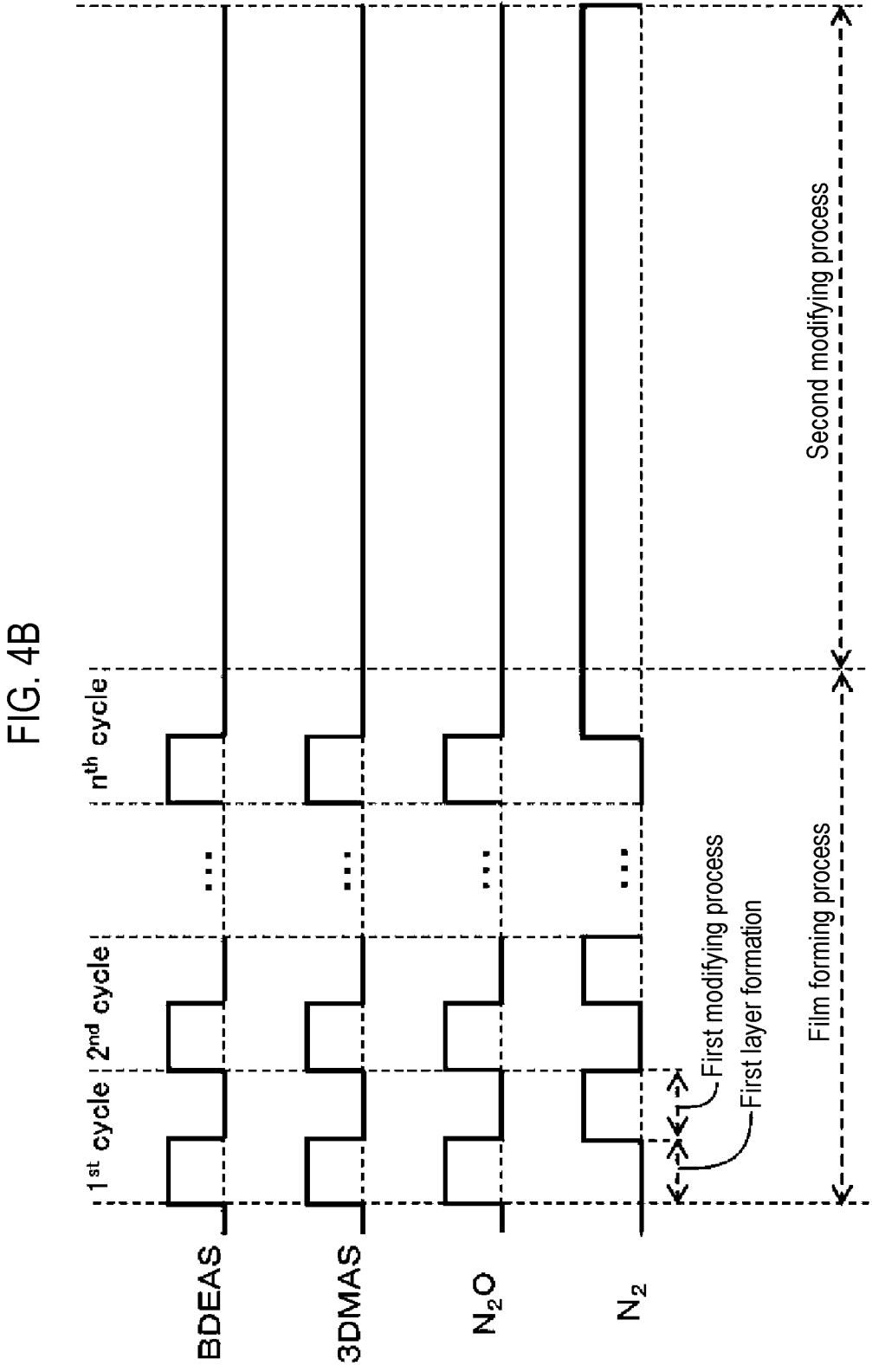

As illustrated in the film forming sequence of FIG. 4B and described in the following film forming sequence, the first aminosilane (BDEAS gas), the second aminosilane (3DMAS gas) different from the first aminosilane, and the oxidant ($N_2O$ gas) may be simultaneously supplied to the wafer 200 in Step 1 as described above.

$$(BDEAS+3DMAS+N_2O \rightarrow 1st\ anneal) \times n \rightarrow$$
$$2st\ anneal \Rightarrow SiOCN$$

This modification can achieve the same effects as the film forming sequence illustrated in FIG. 4A. In addition, since two kinds of different aminosilanes (double aminosilane) are used as the precursor, it is possible to finely adjust the composition ratio, particularly the C concentration and the N concentration, of the finally formed first film. Thus, it is possible to finely adjust the dielectric constant and processing resistance of the finally formed first film. In addition, since the two kinds of aminosilanes are supplied simultaneously, it is possible to avoid an increase in a time period needed per cycle as compared with a second modification to be described later, thereby preventing a decrease in the productivity.

The description "different kinds of aminosilanes" as used herein means, for example, that the number of amino ligands in one molecule of the first aminosilane is different from the number of amino ligands in one molecule of the second aminosilane. This description may also mean that the number of C atoms in one molecule of the first aminosilane is different from the number of C atoms in one molecule of the second aminosilane. This description may also mean that the number of N atoms in one molecule of the first aminosilane is different from the number of N atoms in one molecule of the second aminosilane. This description may also mean that the ratio of the number of C atoms to the number of N atoms in one molecule of the first aminosilane (C/N ratio) is different from the C/N ratio in one molecule of the second aminosilane.

Even when alkoxysilane is used instead of the second aminosilane, the same effects as this modification can be obtained. The same applies to the following different modifications. When alkoxysilane is used instead of the second aminosilane, it is possible to finely adjust the composition of the film in the way of increasing the O concentration of the finally formed film or decreasing the N concentration thereof. Examples of the alkoxysilane may include dimethyldimethoxysilane (($CH_3O)_3SiCH_3$) gas, methyltriethoxysilane (($C_2H_5O)_3SiCH_3$) gas or the like, in addition to the above-mentioned methyltrimethoxysilane gas.
(Second Modification)

Figure 5A:
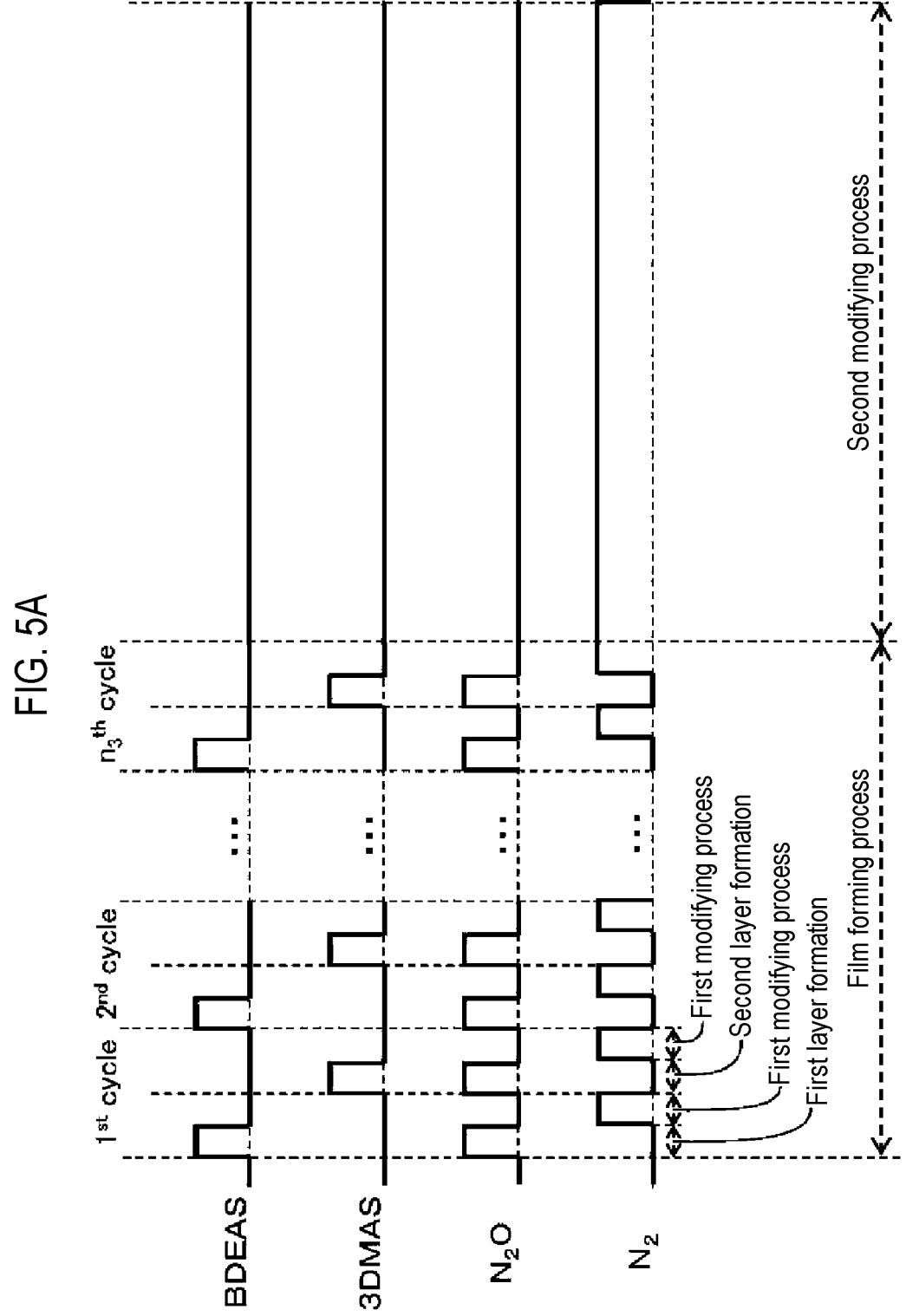
FIGS. 5A and 5B are diagrams showing modifications of the film forming sequence according to the embodiment of the present disclosure.

As illustrated in the film forming sequence of FIG. 5A and described in the following film forming sequence, a step of forming a second film (SiOCN film) on the wafer 200 may be further performed by performing a cycle a predetermined number of times, the cycle including non-simultaneously performing a step of forming the second layer (SiOCN layer) by simultaneously supplying the second aminosilane (3DMAS gas), which is different from the first aminosilane (BDEAS gas), and the oxidant ($N_2O$ gas) to the wafer 200; and a step of performing the first modifying process to the second layer under the first temperature. Then, a laminated film (nano-laminate film) may be formed by alternately laminating the first film formed using the BDEAS gas and the second film formed using the 3DMAS gas, and may then be subjected to the second modifying process. FIG. 5A shows an example in which each of n1 and n2 in the following film forming sequence is set to one.

$$[(BDEAS+N_2O \rightarrow 1st\ anneal) \times n_1 \rightarrow (3DMAS+$$
$$N_2O \rightarrow 1st\ anneal) \times n_2] \times n_3 \rightarrow 2nd\ anneal \Rightarrow SiOCN$$

This modification can also achieve the same effects as the film formation sequence illustrated in FIG. 4A. In this modification, the first film formed using the BDEAS gas and the second film formed using the 3DMAS gas have different compositions. That is to say, at least one of the C concentration, the N concentration, or the ratio of C concentration to N concentration (C/N ratio) differs between the first film and the second film. Therefore, by changing the ratio of n1 and n2, for example, the composition ratio, particularly the C concentration and the N concentration, of the finally formed film (laminated film) can be more precisely finely adjusted. Further, according to this modification, since the mutual reaction of two kinds of aminosilane can be separated, it is possible to more precisely and stably control the composition ratio of the finally formed film than that in the first modification.
(Third Modification)

Figure 5B:
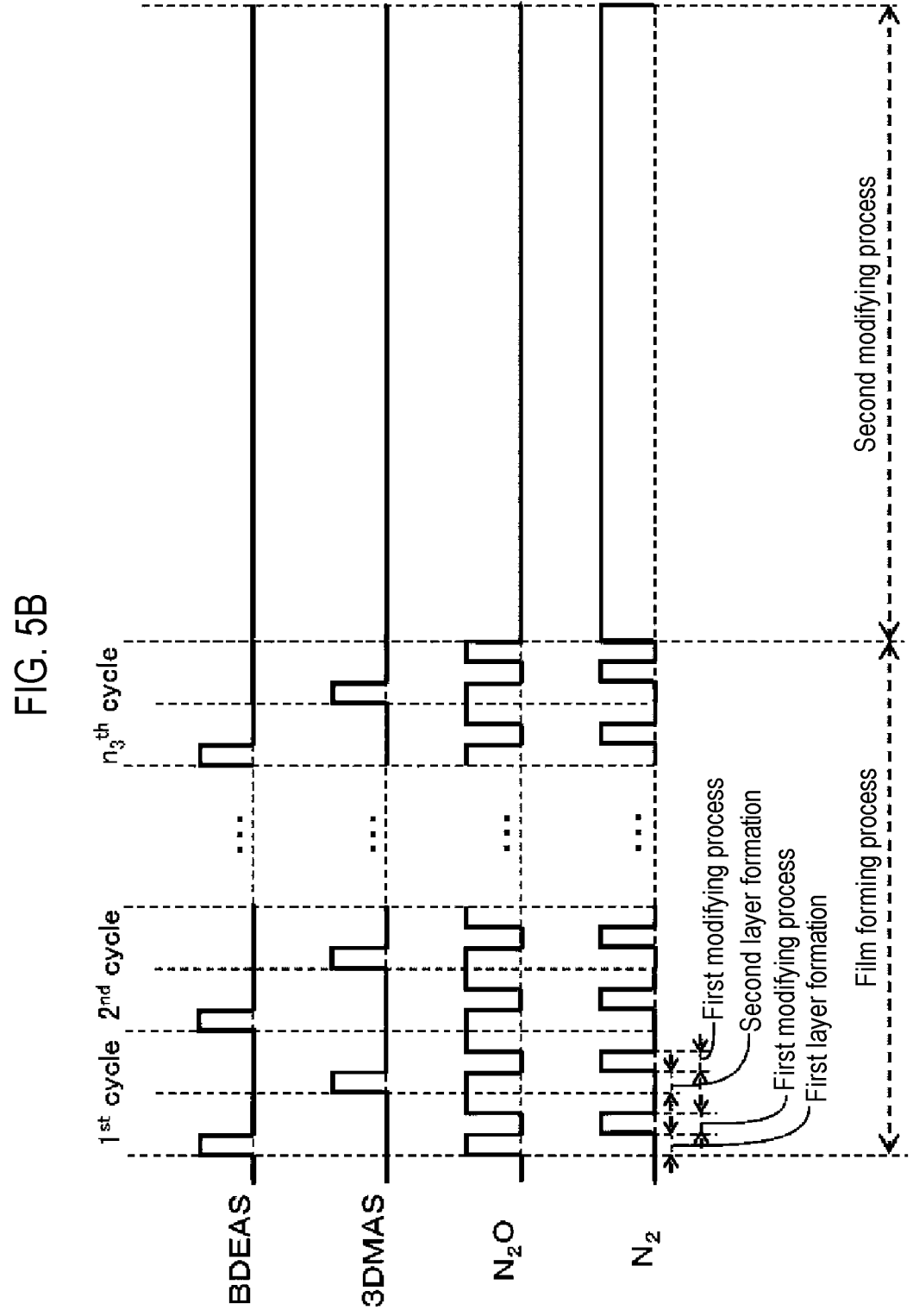

As illustrated in the film forming sequence of FIG. 5B and described in the following film forming sequence, after the first layer or the second layer formed on the wafer 200 are subjected to the first modifying process, an oxidizing step of supplying $N_2O$ gas to each of the first-modified layers may be further performed. FIG. 5B shows an example in which each of n1 and n2 in the following film forming sequence is set to one.

$$[(BDEAS+N_2O \rightarrow 1st\ anneal \rightarrow N_2O) \times n_1 \rightarrow (3DMAS+$$
$$N_2O \rightarrow 1st\ anneal \rightarrow N_2O) \times n_2] \times n_3 \rightarrow 2nd$$
$$anneal \Rightarrow SiOCN$$

This modification can also achieve the same effects as the film formation sequence illustrated in FIG. 4A. Further, by supplying the $N_2O$ gas to each of the first-modified layers, it is possible to further oxidize these layers to promote desorption of impurities from the layers and densification of the layers. As a result, it is possible to make the finally formed film a film having a lower dielectric constant and better processing resistance.

(Fourth Modification)

Figure 6A:
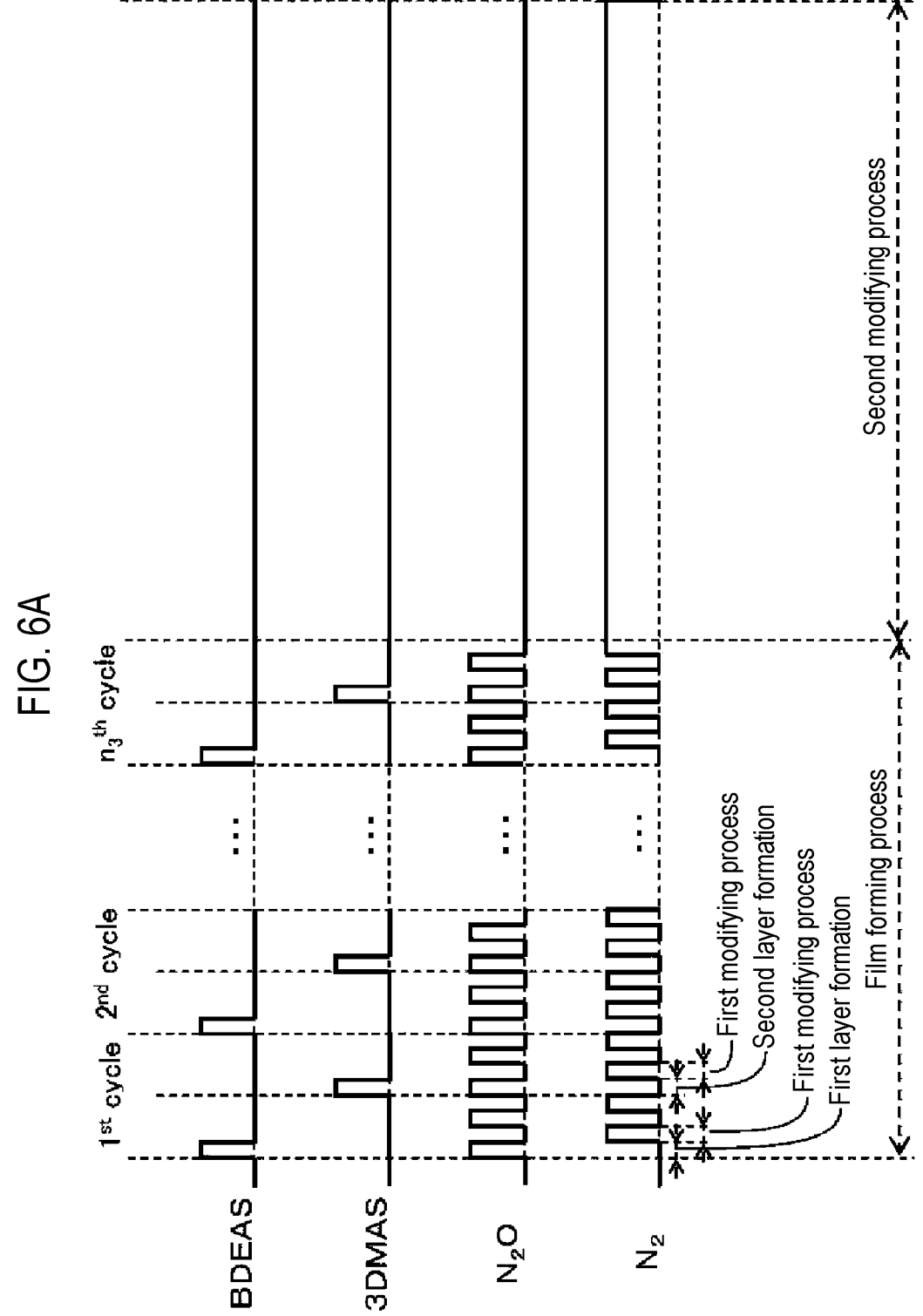
FIGS. 6A and 6B are diagrams showing modifications of the film forming sequence according to the embodiment of the present disclosure.

As illustrated in the film forming sequence of FIG. 6A and described in the following film forming sequence, after the first layer or the second layer formed on the wafer 200 is subjected to the first modifying process, an oxidizing step of supplying $N_2O$ gas to each of the first-modified layers may be performed and then the same first modifying process as in Step 2 may be performed again. FIG. 6A shows an example in which each of n1 and n2 in the following film forming sequence is set to one.

$$[(BDEAS+N_2O \rightarrow 1st\ anneal \rightarrow N_2O \rightarrow 1st\ anneal) \times n_1 \rightarrow (3DMAS+N_2O \rightarrow 1st\ anneal \rightarrow N_2O \rightarrow 1st\ anneal) \times n_2] \times n_3 \rightarrow 2nd\ anneal \Rightarrow SiOCN$$

This modification can also achieve the same effects as the film formation sequence illustrated in FIG. 4A and the second and third modifications. Further, by supplying the $N_2O$ gas alone to each of the first-modified layers and performing the first modifying process again, which is the same as in Step 2, it is possible to promote desorption of impurities from the layers and densification of the layers. As a result, it is possible to make the finally formed film a film having a lower dielectric constant and better processing resistance.

(Fifth Modification)

Figure 6B:
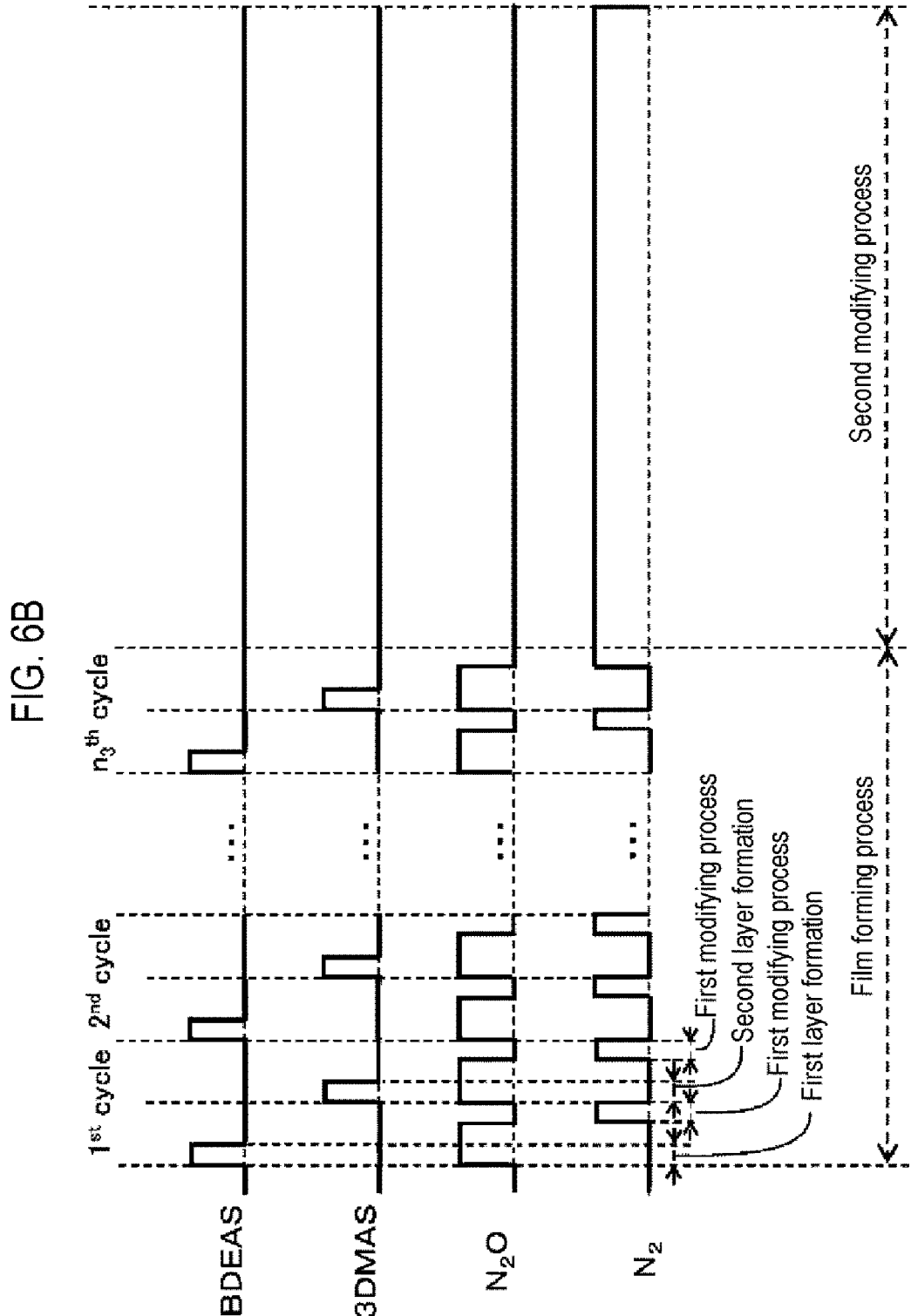

As illustrated in the film forming sequence of FIG. 6B and described in the following film forming sequence, after the first layer or the second layer is formed on the wafer 200, an oxidizing step of supplying $N_2O$ gas to each of the formed layers may be performed and then the first modifying process may be performed on each of these layers. FIG. 6B shows an example in which each of n1 and n2 in the following film forming sequence is set to one, respectively.

$$[(BDEAS+N_2O \rightarrow N_2O \rightarrow 1st\ anneal) \times n_1 \rightarrow (3DMAS+N_2O \rightarrow N_2O \rightarrow 1st\ anneal) \times n_2] \times n_3 \rightarrow 2nd\ anneal \Rightarrow SiOCN$$

This modification can also achieve the same effects as the film formation sequence illustrated in FIG. 4A and the second modification. Further, by performing the oxidizing step before the first modifying process, it is possible to further oxidize the first and second layers formed on the wafer 200 to promote desorption of impurities from the layers and densification of the layers. As a result, it is possible to make the finally formed film a film having a lower dielectric constant and better processing resistance.

(Sixth Modification)

Figure 7:
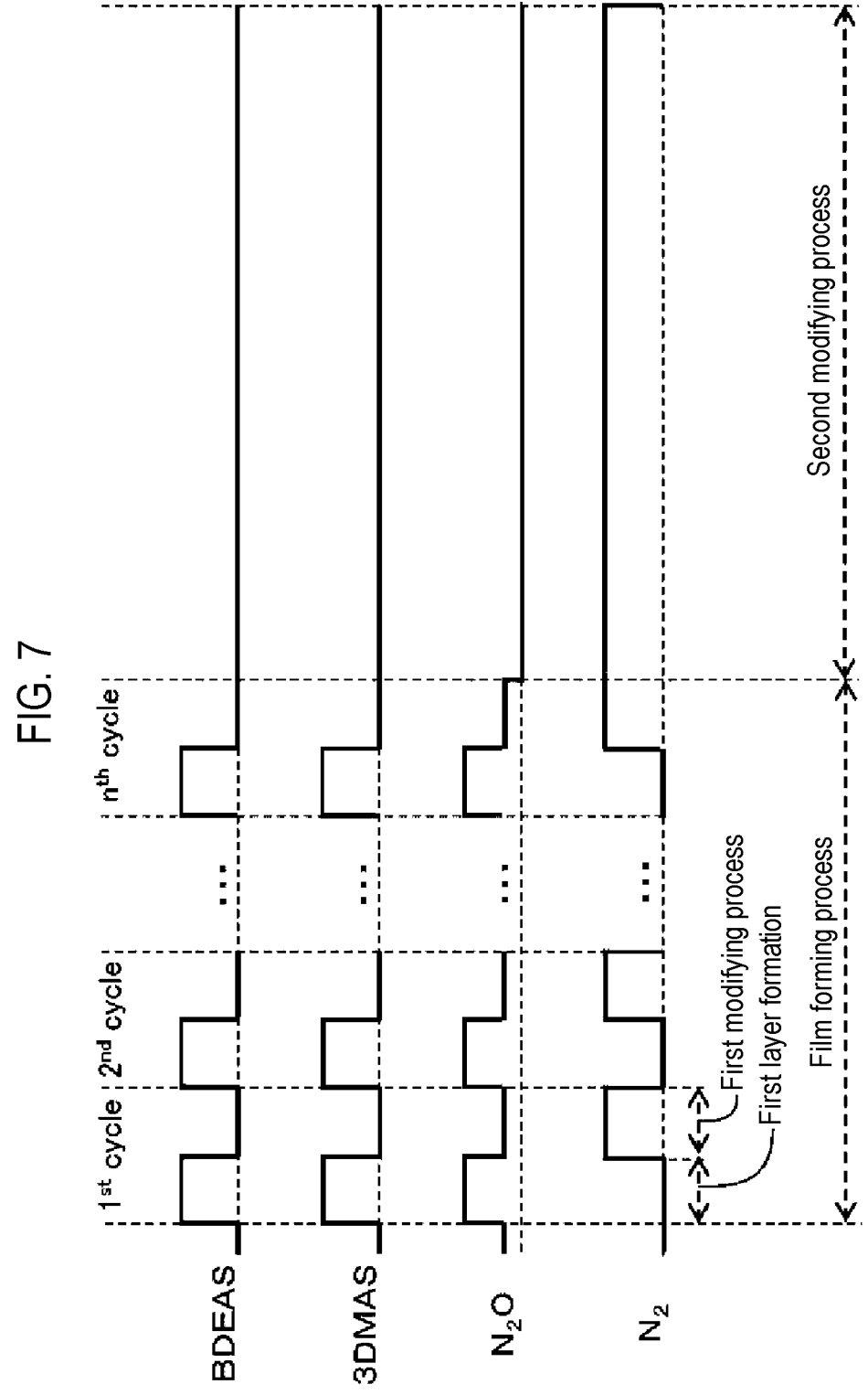
FIG. 7 is a diagram showing a modification of the film forming sequence according to the embodiment of the present disclosure.

As illustrated in the film forming sequence of FIG. 7 and described in the following film forming sequence, the supply of $N_2O$ gas to the wafer 200 may be continuously performed during the film forming step. Further, in the film forming step, the supply of $N_2O$ gas to the wafer 200 may be started prior to the supply of aminosilane or the like to the wafer 200.

$$N_2O\ continuous\ flow+(BDEAS+3DMAS+N_2O \rightarrow 1st\ anneal) \times n \rightarrow 2nd\ anneal \Rightarrow SiOCN$$

This modification can also achieve the same effects as the film forming sequence illustrated in FIG. 4A and the first modification. Further, by continuously supplying the $N_2O$ gas to the wafer 200 during the film forming step, it is possible to promote oxidation of the first layer and the second layer formed on the wafer 200, that is, desorption of impurities from the layers and densification of the layers. As a result, it is possible to make the finally formed film a film having a lower dielectric constant and better processing resistance. Further, by starting the supply of $N_2O$ gas prior to the supply of aminosilane or the like, it is possible to improve the initial state of film formation. For example, it is possible to modify the surface layer of a base in the film forming process, shorten the incubation time, and improve the film quality at the beginning of film formation.

OTHER EMBODIMENTS OF THE PRESENT DISCLOSURE

While some embodiments of the present disclosure have been described in detail above, the present disclosure is not limited to the aforementioned embodiments but may be differently modified without departing from the subject matter of the present disclosure.

For example, the case where the film forming step and the second modifying step are performed in the same process chamber (in-situ) has been described in the above embodiments, but the present disclosure is not limited to such an aspect. That is to say, the film forming step and the second modifying step may be performed in different process chambers (ex-situ). When the series of steps is performed in-situ, the wafer 200 is not exposed to the air in the course of the process and can be processed consistently and stably while keeping it in a clean atmosphere. If the respective steps are performed ex-situ, the temperature in each process chamber can be preset to, for example, a processing temperature at each step or a temperature close thereto, thereby reducing the time period needed for a change of temperature in the process chamber so that productivity can be improved. In this case, since the temperature in each process chamber is not changed, it is possible to avoid an adverse influence due to peeling of a SiOCN film deposited in the process chamber.

Recipes used in substrate processing may be prepared individually according to the processing contents and may be stored in the memory device 121c via a telecommunication line or the external memory device 123. Moreover, at the beginning of the substrate processing, the CPU 121a may properly select an appropriate recipe from the recipes stored in the memory device 121c according to the contents of the processing. Thus, it is possible for a single substrate processing apparatus to form films of various kinds, composition ratios, qualities, and thicknesses with enhanced reproducibility. In addition, it is possible to reduce an operator's burden and to quickly start the substrate processing while avoiding an operation error.

The recipes mentioned above are not limited to newly-prepared ones but may be prepared, for example, by modifying existing recipes that are already installed in the substrate processing apparatus. Once the recipes are modified, the modified recipes may be installed in the substrate processing apparatus via a telecommunication line or a recording medium storing the recipes. In addition, the existing recipes already installed in the substrate processing apparatus may be directly modified by operating the input/output device 122 of the substrate processing apparatus.

The example in which films are formed using a batch-type substrate processing apparatus capable of processing a plurality of substrates at a time has been described in the above embodiments. The present disclosure is not limited to the above embodiments but may be appropriately applied, for example, to a case where films are formed using a single-wafer-type substrate processing apparatus capable of processing a single substrate or several substrates at a time. In addition, the example in which films are formed using a substrate processing apparatus provided with a hot-wall-type processing furnace has been described in the above embodiments. The present disclosure is not limited to the above embodiments but may be appropriately applied to a case where films are formed using a substrate processing apparatus provided with a cold-wall-type processing furnace.

In the case of using these substrate processing apparatuses, film formation may be performed according to the same sequence and processing conditions as those in the above embodiments and modifications, and the same effects as those of the above embodiments and modifications can be achieved.

The above embodiments, modifications and so on may be used in proper combination. The processing procedures and processing conditions used in this case may be the same as those of the above embodiments and modifications.

EXAMPLES

Examples will be described below.

For Sample 1, the substrate processing apparatus illustrated in FIG. 1 was used to form a SiOCN film on a wafer by performing a step of simultaneously and continuously supplying BDEAS gas and $N_2O$ gas to the wafer. When Sample 1 is prepared, neither the first modifying process nor the second modifying process was performed. Except for this point, the processing procedures and processing conditions for preparing Sample 1 are the same as those of the film forming sequence illustrated in FIG. 4A.

For Sample 2, the substrate processing apparatus illustrated in FIG. 1 was used to form a SiOCN film on a wafer by performing a step of simultaneously and continuously supplying BDEAS gas and $N_2O$ gas to the wafer. When Sample 2 is prepared, the first modifying process was not performed but the second modifying process was performed. Except for this point, the processing procedures and processing conditions for preparing Sample 2 are the same as those of the film forming sequence illustrated in FIG. 4A.

For Sample 3, the substrate processing apparatus illustrated in FIG. 1 was used to form a SiOCN film on a wafer by performing a cycle a predetermined number of times, the cycle including non-simultaneously performing Step 1 of simultaneously supplying BDEAS gas and $N_2O$ gas to the wafer and Step 2 of performing a first modifying process to a first layer formed on the wafer under a first temperature. When Sample 3 is prepared, the first modifying process was performed but the second modifying process was not performed. Except for this point, the processing procedures and processing conditions for preparing Sample 3 are the same as those of the film forming sequence illustrated in FIG. 4A.

For Sample 4, the substrate processing apparatus illustrated in FIG. 1 was used to form a SiOCN film on a wafer according to the film forming sequence illustrated in FIG. 4A. When Sample 4 is prepared, both the first modifying process and the second modifying process were performed. The processing conditions for preparing Sample 4 are the same as those of the film forming sequence illustrated in FIG. 4A.

Figure 8:
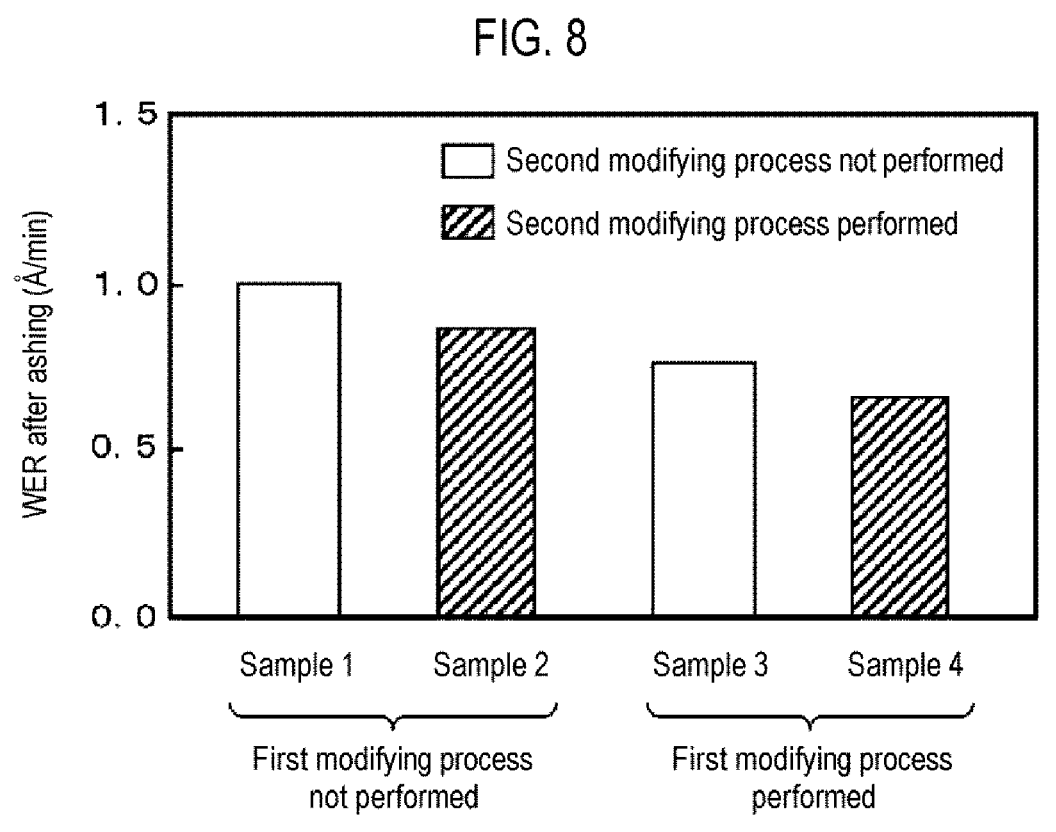

An ashing process of supplying $O_2$ plasma to a surface of each of the films of Samples 1 to 4 and an etching process of supplying an HF aqueous solution of 1% concentration to the surface of each film after the ashing process were then performed in that order, and the ashing resistances of the films, that is, the HF resistance after the ashing process, were evaluated. FIG. 8 shows results of evaluation of the Wet Etching Rate (WER) on the respective films of Samples 1 to 4 after the ashing process. In FIG. 8, the horizontal axis represents Samples 1 to 4 and the vertical axis represents WER [A/min] after the ashing process.

According to FIG. 8, it can be seen that the WERs for Samples 3 and 4 after the ashing process are smaller than those for Samples 1 and 2. That is to say, by intermittently performing the first modifying process in the course of a film forming process, it is possible to improve the ashing resistance of the finally formed film, that is, the HF resistance after the ashing process. Further, according to FIG. 8, it can be seen that the WER for Sample 2 after the ashing process is smaller than Sample 1, and for Sample 4 than Sample 3. That is to say, by performing the second modifying process under the second temperature that is higher than the film formation temperature (the first temperature) after the film forming process, it is possible to improve the ashing resistance of the finally formed film, that is, the HF resistance after the ashing process.

ASPECTS OF PRESENT DISCLOSURE

Hereinafter, several aspects of the present disclosure will be additionally described as supplementary notes.

Supplementary Note 1

According to one aspect of the present disclosure, there is provided a method of manufacturing a semiconductor device or a method of processing a substrate, including: forming a first film containing silicon, oxygen, carbon and nitrogen on a substrate by performing a first cycle a predetermined number of times, the first cycle including non-simultaneously performing: forming a first layer containing silicon, oxygen, carbon and nitrogen by simultaneously supplying first aminosilane and an oxidant to the substrate and performing a first modifying process to the first layer under a first temperature; and performing a second modifying process to the first film under a second temperature that is higher than the first temperature.

Supplementary Note 2

The method of Supplementary Note 1 further includes: supplying second aminosilane that is different from the first aminosilane or alkoxysilane to the substrate.

Supplementary Note 3

In the method of Supplementary Note 2, the act of forming the first layer includes simultaneously supplying the second aminosilane or alkoxysilane, the first aminosilane and the oxidant.

Supplementary Note 4

The method of Supplementary Note 2 further includes: forming a second film containing silicon, oxygen, carbon and nitrogen by performing a second cycle a predetermined number of times, the second cycle including non-simultaneously performing: forming a second layer containing silicon, oxygen, carbon and nitrogen by simultaneously supplying the second aminosilane or the alkoxysilane and the oxidant and performing the first modifying process to the second layer under the first temperature; and forming a laminated film in which the first film and the second film are alternately laminated on the substrate by alternately performing the act of forming the first film and the act of forming the second film, wherein the act of performing the second modifying process includes performing the second modifying process to the laminated film.

The composition of the first layer may be different from the composition of the second layer and the composition of the first film may be different from the composition of the second film. The compositions may include a carbon concentration, a nitrogen concentration, and a ratio of the carbon concentration to the nitrogen concentration.

Supplementary Note 5

In the method of any one of Supplementary Notes 1 to 4, in the act of forming the first film (the second film), the oxidant is continuously supplied.

Supplementary Note 6

In the method of Supplementary Note 4, in the act of forming the laminated film, the oxidant is continuously supplied.

Supplementary Note 7

In the method of any one of Supplementary Notes 1 to 6, in the act of forming the first film (the second film), the supply of the oxidant starts prior to the supply of the first aminosilane (the second aminosilane or the alkoxysilane).

Supplementary Note 8

In the method of any one of Supplementary Notes 2 to 7, the number of amino ligands in one molecule of the first aminosilane is different from the number of amino ligands in one molecule of the second aminosilane.

Supplementary Note 9

In the method of any one of Supplementary Notes 2 to 8, the number of carbon atoms in one molecule of the first aminosilane is different from the number of carbon atoms in one molecule of the second aminosilane.

Supplementary Note 10

In the method of any one of Supplementary Notes 2 to 9, the number of nitrogen atoms in one molecule of the first aminosilane is different from the number of nitrogen atoms in one molecule of the second aminosilane.

Supplementary Note 11

In the method of any one of Supplementary Notes 2 to 10, the ratio of the number of carbon atoms to the number of nitrogen atoms in one molecule of the first aminosilane is different from the ratio of the number of carbon atoms to the number of nitrogen atoms in one molecule of the second aminosilane.

Supplementary Note 12

In the method of any one of Supplementary Notes 1 to 11, the oxidant includes a nitrogen oxide-based gas. The oxidant may include a nitrous oxide.

Supplementary Note 13

According to another aspect of the present disclosure, there is provided a substrate processing apparatus including: a process chamber in which a substrate is processed; an aminosilane supply system configured to supply aminosilane to the substrate in the process chamber; an oxidant supply system configured to supply an oxidant to the substrate in the process chamber; a heater configured to heat the substrate in the process chamber; and a controller configured to control the aminosilane supply system, the oxidant supply system, and the heater to: form a film containing silicon, oxygen, carbon, and nitrogen on the substrate in the process chamber by performing a cycle a predetermined number of times, the cycle including non-simultaneously performing: forming a layer containing silicon, oxygen, carbon, and nitrogen by simultaneously supplying the aminosilane and the oxidant to the substrate; and performing a first modifying process to the layer under a first temperature; and perform a second modifying process to the film under a second temperature that is higher than the first temperature.

Supplementary Note 14

According to another aspect of the present disclosure, there is provided a non-transitory computer-readable recording medium storing a program that causes a computer to perform, in a process chamber of a substrate processing apparatus, a process of: forming a film containing silicon, oxygen, carbon, and nitrogen on a substrate by performing a cycle a predetermined number of times, the cycle including non-simultaneously performing: forming a layer containing silicon, oxygen, carbon, and nitrogen by simultaneously supplying aminosilane and an oxidant to the substrate and performing a first modifying process to the layer under a first temperature; and performing a second modifying process to the film under a second temperature that is higher than the first temperature.

According to the present disclosure in some embodiments, it is possible to improve the film quality of a SiOCN film formed on a substrate.

While certain embodiments have been described, these embodiments have been presented by way of an example, and are not intended to limit the scope of the disclosures. Indeed, the embodiments described herein may be embodied in a variety of other forms. Furthermore, various omissions, substitutions and changes in the form of the embodiments described herein may be made without departing from the scope of the disclosures. The accompanying claims and their equivalents are intended to cover such forms or modifications as would fall within the scope of the disclosures.

What is claimed is:

1. A method of processing a substrate, comprising:
forming a first film containing silicon, oxygen, carbon and nitrogen on a substrate by performing a first cycle multiple times, the first cycle including:
forming a first layer containing silicon, oxygen, carbon and nitrogen by supplying a first precursor containing silicon, nitrogen and carbon and an oxidant to the substrate; and
performing a first modifying process to the first layer at a first temperature to desorb impurities contained in the first layer and densify the first layer; and
performing, after forming the first film, a second modifying process to the first film at a second temperature that is not less than the first temperature to desorb impurities contained in the first film and densify the first film.

2. The method according to claim 1, further comprising supplying a second precursor containing silicon, nitrogen and carbon that is different from the first precursor to the substrate.

3. The method according to claim 2, wherein the act of forming the first layer comprises supplying the second precursor, the first precursor and the oxidant.

4. The method according to claim 2, further comprising:

forming a second film containing silicon, oxygen, carbon and nitrogen by performing a second cycle a predetermined number of times, the second cycle including:

forming a second layer containing silicon, oxygen, carbon and nitrogen by supplying the second precursor and the oxidant to the substrate; and performing the first modifying process to the second layer under the first temperature; and forming a laminated film in which the first film and the second film are alternately laminated on the substrate by alternately performing the act of forming the first film and the act of forming the second film, wherein the act of performing the second modifying process comprises performing the second modifying process to the laminated film.

5. The method according to claim 4, wherein a composition of the first layer is different from a composition of the second layer, and wherein a composition of the first film is different from a composition of the second film.

6. The method according to claim 4, wherein a carbon concentration, a nitrogen concentration or a ratio of the carbon concentration to the nitrogen concentration in the first layer is different from that in the second layer, and wherein a carbon concentration, a nitrogen concentration or a ratio of the carbon concentration to the nitrogen concentration in the first film is different from that in the second film.

7. The method according to claim 4, wherein the oxidant is continuously supplied in the act of forming the first film.

8. The method according to claim 4, wherein the oxidant is continuously supplied in the act of forming the second film.

9. The method according to claim 4, wherein the oxidant is continuously supplied in the act of forming the laminated film.

10. The method according to claim 4, wherein the supply of the oxidant starts prior to the supply of the first precursor in the act of forming the first film.

11. The method according to claim 4, wherein the supply of the oxidant starts prior to the supply of the second precursor in the act of forming the second film.

12. The method according to claim 2, wherein the first precursor includes first aminosilane and the second precursor includes second aminosilane or alkoxysilane.

13. The method according to claim 12, wherein a number of amino ligands in one molecule of the first aminosilane is different from a number of amino ligands in one molecule of the second aminosilane.

14. The method according to claim 2, wherein a number of carbon atoms in one molecule of the first precursor is different from a number of carbon atoms in one molecule of the second precursor.

15. The method according to claim 2, wherein a number of nitrogen atoms in one molecule of the first precursor is different from a number of nitrogen atoms in one molecule of the second precursor.

16. The method according to claim 2, wherein a ratio of a number of carbon atoms to a number of nitrogen atoms in one molecule of the first precursor is different from a ratio of a number of carbon atoms to a number of nitrogen atoms in one molecule of the second precursor.

17. The method according to claim 1, wherein the oxidant is continuously supplied in the act of forming the first film.

18. The method according to claim 1, wherein the supply of the oxidant starts prior to the supply of the first precursor in the act of forming the first film.

19. The method according to claim 1, wherein the first precursor includes first aminosilane.

20. The method according to claim 1, wherein the oxidant includes a nitrogen oxide-based gas.

21. The method according to claim 1, wherein the act of forming the first layer comprises simultaneously supplying the first precursor and the oxidant.

22. A method of manufacturing a semiconductor device comprising the method of claim 1.

23. A substrate processing apparatus comprising:

a precursor supply system configured to supply a precursor containing silicon, nitrogen and carbon to the substrate;

an oxidant supply system configured to supply an oxidant to the substrate;

a heater configured to heat the substrate; and a controller configured to be capable of controlling the precursor supply system, the oxidant supply system and the heater so as to:

form a film containing silicon, oxygen, carbon and nitrogen on the substrate by performing a cycle multiple times, the cycle including:

forming a layer containing silicon, oxygen, carbon and nitrogen by supplying the precursor and the oxidant to the substrate; and performing a first modifying process to the layer at a first temperature to desorb impurities contained in the layer and densify the layer; and perform, after forming the film by performing the cycle multiple times, a second modifying process to the film at a second temperature that is not less than the first temperature to desorb impurities contained in the film and densify the film.

24. A non-transitory computer-readable recording medium storing a program that causes, by a computer, a substrate processing apparatus to perform a process comprising:

forming a film containing silicon, oxygen, carbon and nitrogen on a substrate by performing a cycle multiple times, the cycle including:

forming a layer containing silicon, oxygen, carbon and nitrogen by supplying a precursor containing silicon, nitrogen and carbon and an oxidant to the substrate; and performing a first modifying process to the layer at a first temperature to desorb impurities contained in the layer and densify the layer; and performing, after forming the film by performing the cycle multiple times, a second modifying process to the film at a second temperature that is not less than the first temperature to desorb impurities contained in the film and densify the film.

* * * * *